United States Patent [19]
Takahashi

[11] Patent Number: 5,583,696
[45] Date of Patent: Dec. 10, 1996

[54] REFLECTION AND REFRACTION OPTICAL SYSTEM AND PROJECTION EXPOSURE APPARATUS USING THE SAME

[75] Inventor: Kazuhiro Takahashi, Utsunomiya, Japan

[73] Assignee: Canon Kabushiki Kaisha, Tokyo, Japan

[21] Appl. No.: 164,527

[22] Filed: Dec. 10, 1993

[30] Foreign Application Priority Data

Dec. 14, 1992 [JP] Japan .................... 4-333104

[51] Int. Cl.⁶ .................... G02B 27/14; G02B 17/00
[52] U.S. Cl. .................... 359/637; 359/727; 359/729
[58] Field of Search .................... 359/637, 727, 359/729, 728

[56] References Cited

U.S. PATENT DOCUMENTS

| | | |
|---|---|---|
| 3,698,808 | 10/1972 | Delmas . |
| 3,917,399 | 11/1975 | Buzawa et al. . |
| 3,963,353 | 6/1976 | Hemstreet . |
| 4,685,777 | 8/1987 | Hirose . |
| 4,747,678 | 5/1988 | Shafer et al. . |
| 4,953,960 | 9/1990 | Williamson .................... 359/663 |
| 5,089,913 | 2/1992 | Singh .................... 359/727 |
| 5,212,593 | 5/1993 | Williamson .................... 359/487 |
| 5,220,454 | 6/1993 | Ichihara .................... 359/487 |
| 5,241,423 | 8/1993 | Chiu .................... 359/727 |
| 5,251,070 | 10/1993 | Hashimoto .................... 359/727 |
| 5,289,312 | 2/1994 | Hashimoto .................... 359/727 |

FOREIGN PATENT DOCUMENTS

| | | | |
|---|---|---|---|
| 604093 | 6/1994 | European Pat. Off. | .................... 359/727 |
| 61-156737 | 7/1986 | Japan . | |
| 5-88088 | 4/1993 | Japan | .................... 359/727 |
| 2014641 | 6/1994 | U.S.S.R. | .................... 359/727 |

*Primary Examiner*—Georgia Y. Epps
*Assistant Examiner*—Ricky Mack
*Attorney, Agent, or Firm*—Fitzpatrick, Cella, Harper & Scinto

[57] ABSTRACT

A reflection and refraction optical system includes a planner beam splitter, a concave mirror and a lens group, for imaging a fine pattern of a reticle upon a wafer, wherein a lens element of the lens group is disposed eccentrically with respect to an optical axis of the system by a predetermined amount or a parallel plate is disposed obliquely with respect to the optical axis, so as to produce a comma or distortion effective to cancel the comma or distortion produced by the beam splitter.

23 Claims, 4 Drawing Sheets

REFLECTION AND REFRACTION OPTICAL SYSTEM AND PROJECTION EXPOSURE APPARATUS USING THE SAME

FIELD OF THE INVENTION AND RELATED ART

This invention relates generally to an imaging optical system such as a reflection and refraction optical system and, more particularly, to a reflection and refraction optical system usable for imaging a fine pattern in manufacture of microdevices such as semiconductor devices (such as ICs or LSIs), image pickup devices (such as CCDs) or display devices (such as liquid crystal panels). In another aspect, the invention is concerned with a projection exposure apparatus using such a reflection and refraction optical system.

The degree of integration of a semiconductor device such as an IC or LSI is increasing, and the fine processing technology for a semiconductor wafer is being developed considerably. In the projection exposure technique, which is the main of portion fine processing technology, the resolution has been increased to a level allowing formation of an image of a linewidth not greater than 0.5 micron.

The resolution can be improved by shortening the wavelength of light used for the exposure process. However, shortening the wavelength restricts the glass materials usable for a projection lens system, and correction of chromatic aberration becomes difficult to attain.

A projection optical system in which the difficulty of correcting chromatic aberration can be reduced may be a reflection and refraction optical system comprising a concave mirror and a lens group, wherein the imaging function mainly attributes to the power of the concave mirror.

Such reflection and refraction optical system may include a beam splitter and a concave mirror, disposed in this order from the object plane side. Light from the object plane may go by way of the beam splitter, and it may be reflected by the concave mirror. After this, the light may go again by way of the beam splitter, and it may be imaged upon an image plane.

For minimization of loss of light, the beam splitter may desirably comprise a planner member. However, use of such a planner member directly leads to aberration of comma or distortion, resulting in deteriorated imaging performance.

SUMMARY OF THE INVENTION

It is an object of the present invention to provide an improved imaging optical system effective to solve problems such as described above.

It is another object of the present invention to provide an improved reflection and refraction optical system effective to solve problems such as described above.

It is a further object of the present invention to provide an improved projection exposure apparatus having an improved imaging optical system, effective to solve problems such as described above.

An imaging optical system according to an aspect of the present invention may include a planner beam splitter inclined with respect to an optical axis, as well as a reflection mirror which are disposed in this order from the object plane side, wherein light from the object plane goes by way of the beam splitter and is reflected by the reflection mirror. The reflected light goes again by way of the beam splitter and is imaged on an image plane. At least one of comma and distortion produced by the beam splitter is substantially corrected.

A reflection and refraction optical system according to another aspect of the present invention may include a planner beam splitter inclined with respect to an optical axis, as well as a concave mirror which are disposed in this order from the object plane side, wherein light from the object plane goes by way of the beam splitter and is reflected by the concave mirror. The reflected light goes again by way of the beam splitter and is imaged on an image plane. At least one of comma and distortion produced by the beam splitter is substantially corrected.

A projection exposure apparatus according to a further aspect of the present invention may include a projection optical system for projecting a pattern of a mask onto a substrate to be exposed, wherein the projection optical system may have a planner beam splitter inclined with respect to an optical axis, as well as a concave mirror, which are disposed in this order from the mask side. Light from the mask goes by way of the beam splitter and is reflected by the concave mirror. The reflected light goes again by way of the beam splitter and is projected on the substrate, whereby the pattern of the mask is imaged thereon. The apparatus may further include means for substantially correcting at least one of comma and distortion produced by the beam splitter.

A reflection and refraction optical system or a projection exposure apparatus according to the present invention may suitably be used for manufacture of microdevices such as semiconductor devices (such as ICs or LSIs), image pickup devices (such as CCDs) or display devices (such as liquid crystal panels). Particularly, a reflection optical system of the present invention when arranged to provide a reduction magnification and used as a projection optical system in combination with deep ultraviolet light, may be effective to image a fine device pattern of a linewidth not greater than 0.5 micron.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
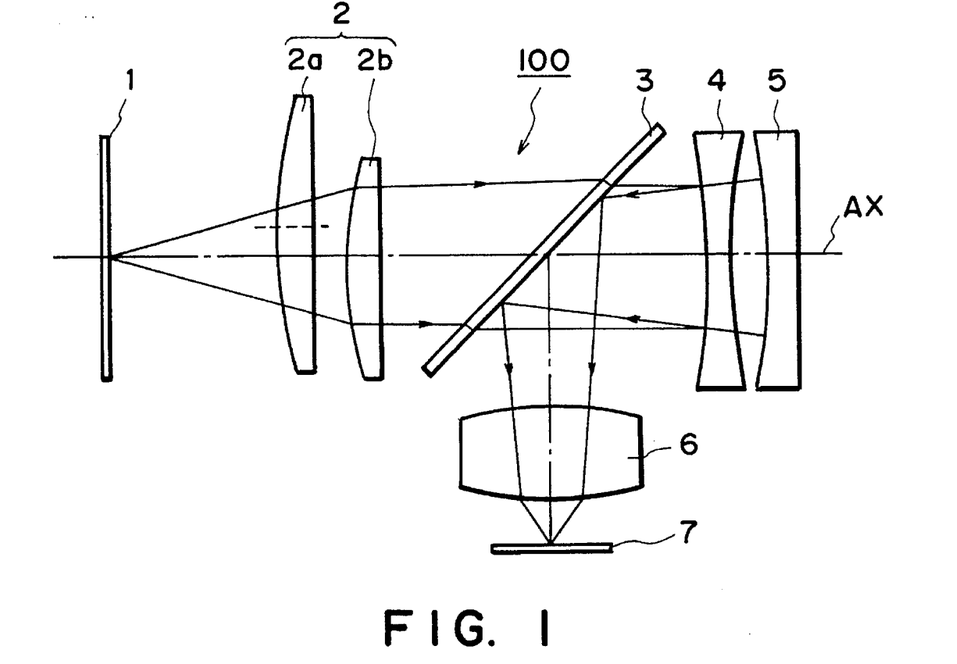
FIG. 1 is a schematic view of a reduction projection exposure apparatus for manufacture of semiconductor devices, according to an embodiment of the present invention.

FIG. 1 illustrates a reduction projection exposure apparatus according to an embodiment of the present invention, for manufacture of semiconductor devices.

Denoted in FIG. 1 at 1 is a reticle having a circuit pattern to be transferred to a wafer 7 for manufacture of semiconductor devices. The reticle 1 is held on an object plane of a reflection and refraction optical system 100, by means of a reticle stage (not shown). The circuit pattern of the reticle can be illuminated with deep ultraviolet light of a wavelength λ (<300 (nm)) from an illumination system (not shown), with uniform illuminance. Divergent light from the illuminated reticle 1, including zeroth order and first order diffraction lights, is received by a first lens group 2 having a positive refracting power. The first lens group 2 serves to converge the received divergent light and to project the light onto a beam splitter 3, which comprises a plane flat plate disposed obliquely with respect to an optical axis AX. The light incident on the beam splitter 3 passes through the same, and it enters a second lens group 4 having a negative refracting power.

The second lens group 4 serves to diverge the light, passing through the polarization beam splitter 3, and to project the same on a concave mirror 5. The concave mirror 5 has a spherical reflection surface which is rotationally symmetrical with respect to the optical axis AX. The concave mirror 5 serves to reflect and converge the received divergent light back to the lens group 4. The light goes again by way of the second lens group 4, and it is projected onto the beam splitter 3. The light reflected and collected by the concave mirror 5 and impinging again on the beam splitter 3, is reflected by this beam splitter 3 downwardly as viewed in the drawing.

Disposed below the beam splitter 3 is a third lens group 6 having a positive refracting power. Further below the third lens group 6, there is a silicon wafer 7 for manufacture of semiconductor devices, which wafer is held by a movable X–Y stage (not shown) so that its surface, to be exposed, coincides with the image plane of the reflection and refraction optical system 100. The third lens group 6 serves to collect the light from the beam splitter, and it contributes to formation of a reduced image of the circuit pattern of the reticle 1 upon the wafer 7.

In the reflection and refraction optical system 100, since the light passing through the beam splitter 3 comprises a flux of light rays which are not completely parallel to the optical axis AX, the beam splitter 3 produces comma of an amount which can not be disregarded. Further, the angle of incidence upon the beam splitter 3 of light from each object point on the reticle 1 differs in depending upon the image height and the direction of each object point from the optical axis AX. As a result, there occurs distortion, on the exposed surface of the wafer 7, in the image height with respect to the lateral direction as viewed in the drawing and in the image height with respect to the direction perpendicular to the sheet of the drawing, of an amount which can not be disregarded.

In the projection exposure apparatus of this embodiment, in consideration thereof, the first lens group 2 of the reflection and refraction optical system 100 comprises a first positive lens 2a and a second positive lens 2b, wherein the first positive lens 2a (its optical axis being depicted by a broken line) is shifted translationally by a predetermined amount with respect to the optical axis AX of the optical system 100, so as to produce a comma effective to cancel the comma produced by the beam splitter 3 and to produce a distortion effective to cancel the distortion produced by the beam splitter 3.

Since in the projection exposure apparatus of this embodiment the unwanted comma and distortion produced by the beam splitter 3 are corrected by the orientation of the first positive lens 2a, a sharp image can be formed on the wafer 7.

Figure 2:
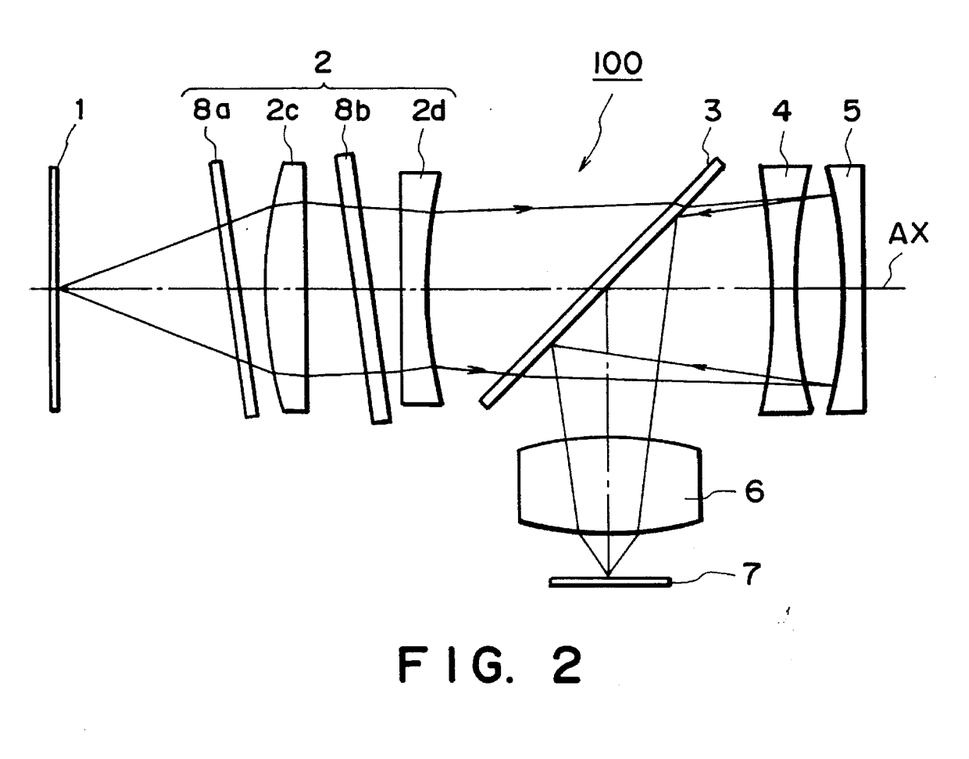
FIG. 2 is a schematic view of a modified form of the projection exposure apparatus of the FIG. 1 embodiment.

In the projection exposure apparatus of this embodiment, the first lens group 2 may be structured as shown in FIG. 2. FIG. 2 is a schematic view of a modified form of the projection exposure apparatus in the FIG. 1 embodiment, and in FIG. 2 like numerals as of FIG. 1 are assigned to corresponding elements. In FIG. 2, denoted at 8a and 8b are parallel flat plates disposed obliquely with respect to the optical axis AX. Denoted at 2c is a positive lens (convex lens), and denoted at 2d is a negative lens (concave lens). The parallel plate 8a is set to produce a comma effective to cancel the comma produced by the beam splitter 3. The parallel plate 8b is set to produce a distortion effective to cancel the distortion produced by the beam splitter 3. In place of arranging these two parallel plates 8a and 8b so that they produce eccentricity aberrations (comma and distortion) independently of each other, these two parallel plates may be arranged so that in combination they produce comma and distortion.

Further, in the projection exposure apparatus of this embodiment, at least one of the lenses or parallel plates constituting the second lens group 4 or the third lens group 6 may be used (e.g., disposed eccentrically or obliquely) for correction of the comma and/or distortion produced by the beam splitter 3. Also, placing the concave mirror 5 eccentrically with respect to the optical axis AX is effective to correct the comma or distortion produced by the beam splitter 3.

Figure 3:
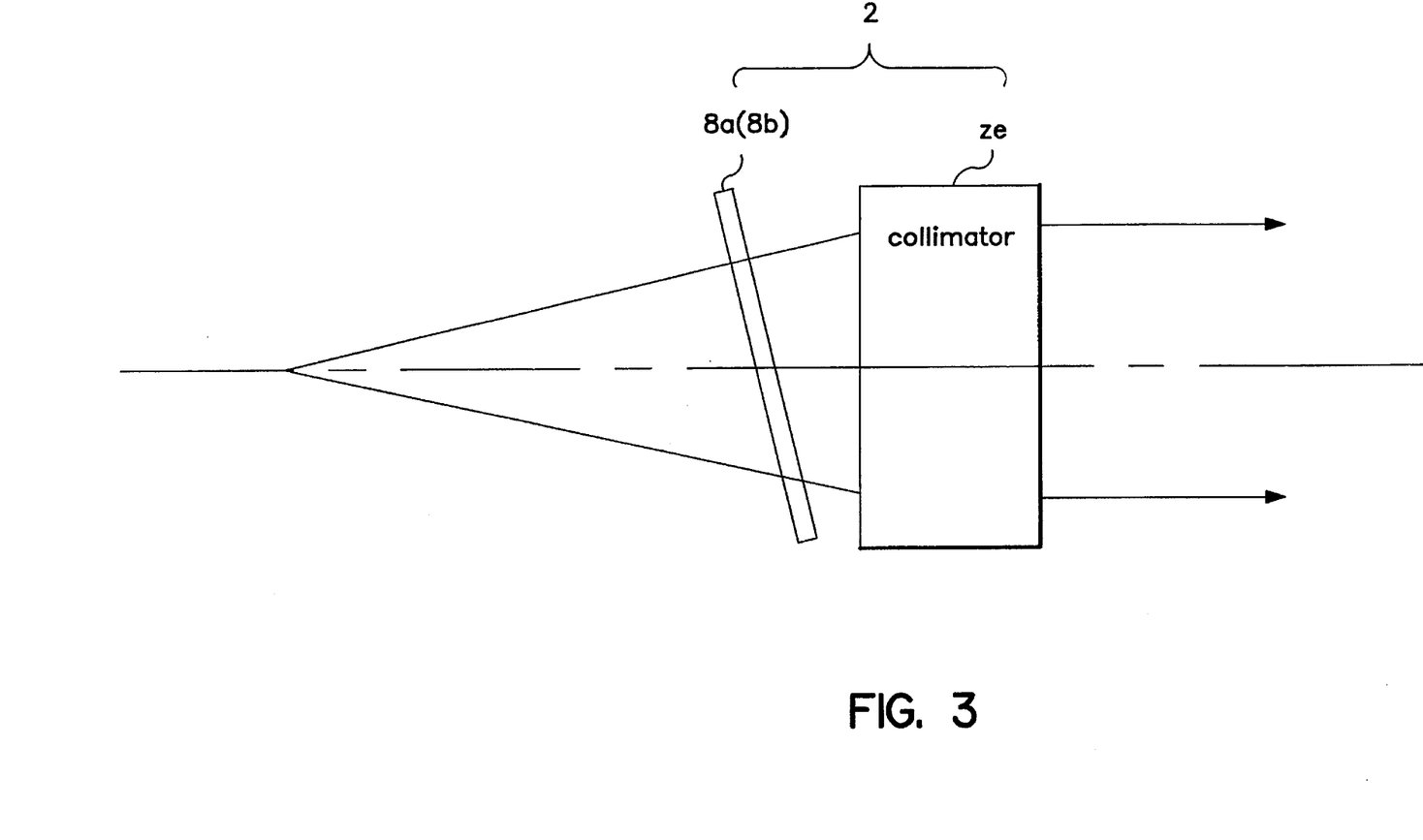
FIG. 3 is a schematic view of an alternative embodiment of a correcting lens system.

FIG. 3 illustrates a possible alternative in the projection exposure apparatus of this embodiment, wherein first lens group 2 may comprise a collimator lens effective to transform the divergent light (on-axis imaging light) from the reticle 1 into a flux of light rays which are made parallel to the optical axis AX of a degree not causing the beam splitter 3 to produce a comma, as well as a lens 8a disposed eccentrically with respect to the optical axis AX (or a parallel flat plate 8b disposed obliquely with respect to the optical axis AX) such that substantially only the distortion produced by the beam splitter 3 is corrected thereby.

The projection exposure apparatus of this embodiment may be provided with an adjusting mechanism for moving holding members of the lens 2a and/or the parallel plates 8a and 8b so as to adjust the amount of eccentricity of the lens 2a and/or the tilt angles of the parallel plates 8a and 8b. In that occasion, any comma and/or distortion produced (of course) by the beam splitter or any other component or produced as a result of an error in assembling of the system, can advantageously be corrected.

Further, in the projection exposure apparatus of this embodiment, the beam splitter 3 may comprise a polarization beam splitter and, additionally, a quarter waveplate may be disposed between the beam splitter 3 and the concave mirror 5. In that occasion, an optical system of high light utilization efficiency is provided.

In the projection exposure apparatus of this embodiment, the reticle stage for supporting the reticle 1 may be disposed horizontally and a reflection mirror may be provided between the reticle stage and the lens group 2 so as to deflect the optical axis AX by 45 deg. In that occasion, the overall size of the apparatus can be made small.

The projection exposure apparatus of this embodiment may be arranged to execute step-and-repeat exposures according to which the X–Y stage on which the wafer 7 is placed is moved stepwise to form circuit patterns on substantially the whole surface of the wafer 7. Alternatively, it may be arranged to execute step-and-scan exposures wherein the X–Y stage on which the wafer 7 is place is moved stepwise and scanningly.

The projection exposure apparatus of this embodiment may be used in combination with a phase shift mask as the reticle 1. In that occasion, it may be possible to image a pattern of a smaller linewidth. Further, the structure of the illumination system (not shown) may be modified into an oblique illumination system by which the reticle 1 is illuminated along a direction inclined with respect to the optical axis AX. Also in that occasion, a pattern of smaller linewidth may be imaged.

The projection exposure apparatus of this embodiment may use a light source comprising a KrF excimer laser (λ~248 nm), an ArF excimer laser (λ~193 nm) or an ultra high pressure Hg lamp (emission line spectrum: λ~250 nm), for example.

Next, an embodiment of a method of manufacturing semiconductor devices based on the reticle 1 and the projection exposure apparatus of FIG. 1, will be explained.

Figure 4:
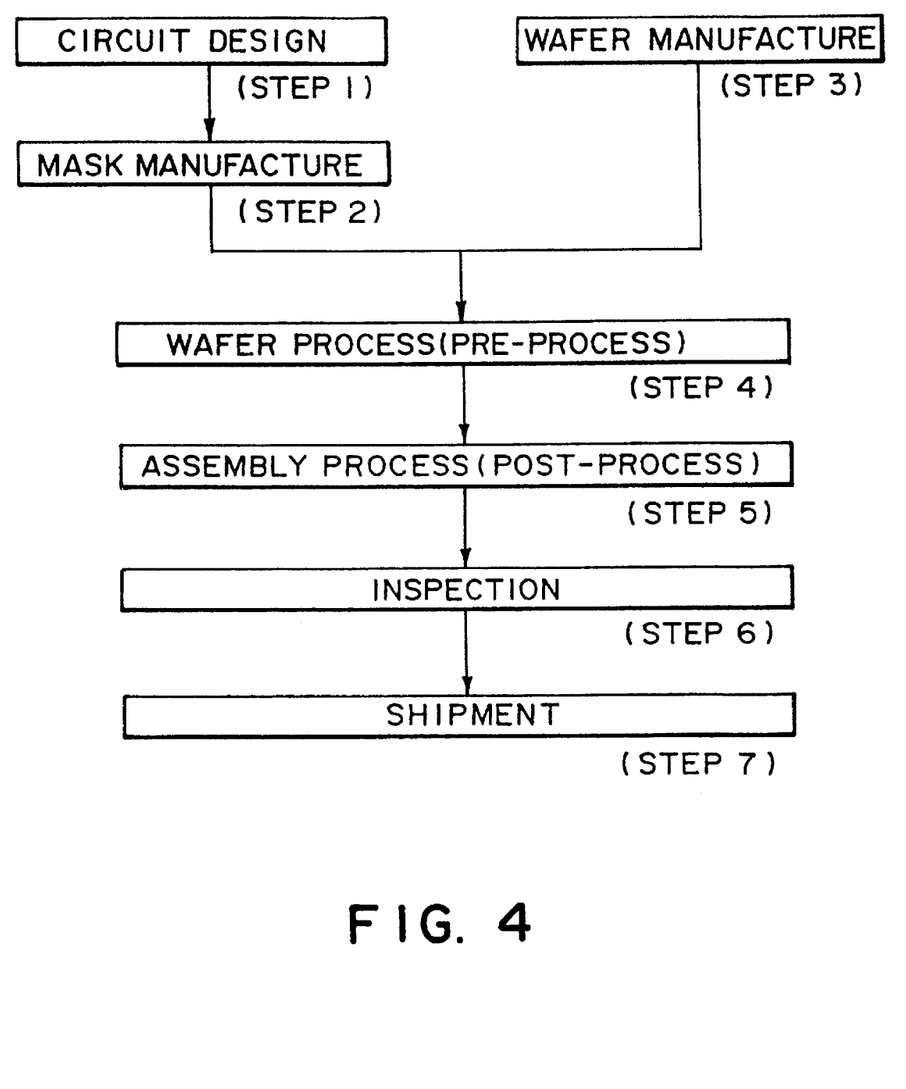
FIG. 4 is a flow chart of semiconductor device manufacturing processes.

FIG. 3 is a flow chart of the sequence of manufacturing a semiconductor device such as a semiconductor chip (e.g. IC or LSI), a liquid crystal panel or a CCD, for example. Step 1 is a design process for designing the circuit of a semiconductor device. Step 2 is a process for manufacturing a mask on the basis of the circuit pattern design. Step 3 is a process for manufacturing a wafer by using a material such as silicon.

Step 4 is a wafer process which is called a pre-process wherein, by using the prepared mask and wafer, circuits are formed on the wafer through lithography. Step 5 subsequent to this is an assembling step which is called a post-process wherein the wafer processed in step 4 is formed into semiconductor chips. This step includes assembling (dicing and bonding) and packaging (chip sealing). Step 6 is an inspection step wherein an operability check, a durability check and so on of the semiconductor devices produced by step 5 are carried out. With these processes, semiconductor devices are finished and they are shipped (step 7).

Figure 5:
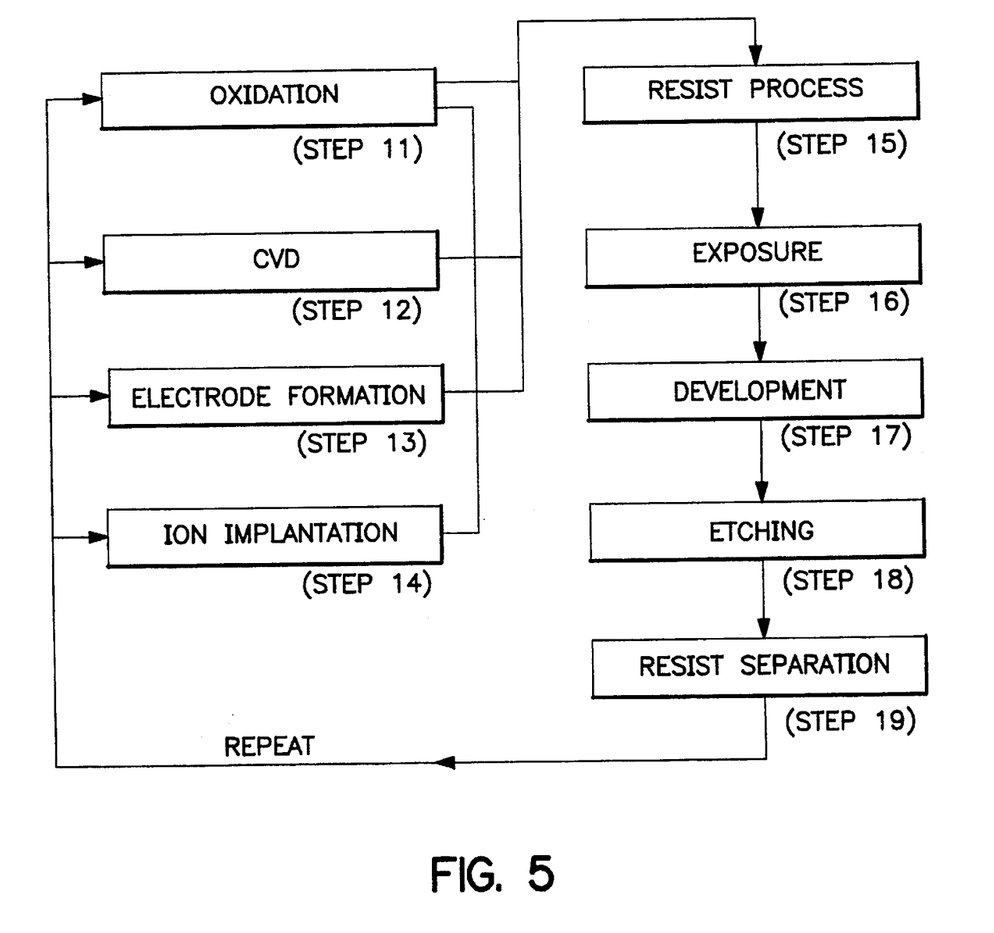
FIG. 5 is a flow chart, illustrating details of a wafer process.

FIG. 5 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes on the wafer by vapor deposition. Step 14 is an ion implanting process for implanting ions in the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

As described hereinbefore, the present invention in an aspect thereof provides an imaging optical system or a reflection and refraction optical system, by which a fine pattern can be projected correctly. Thus, the present invention in another aspect effectively assures an improved projection exposure apparatus having superior projection exposure performance and based on a reflection and refraction optical system, or a method of manufacturing various devices through use of a reflection and refraction optical system.

While the invention has been described with reference to the structures disclosed herein, it is not confined to the details set forth and this application is intended to cover such modifications or changes as may come within the purposes of the improvements or the scope of the following claims.

What is claimed is:

1. An imaging optical system, comprising:

a planar beam splitter;

a reflection mirror; and a correcting optical flat plate inclined with respect to an optical axis of said system and positioned between an object plane and a lens, for substantially correcting comma produced by said beam splitter;

wherein a light beam from an object plane passes through said beam splitter and impinges on said reflection mirror, and wherein the light beam incident on said mirror is reflected back to said beam splitter and is projected onto an image plane by said beam splitter.

2. An imaging optical system according to claim 1, wherein said conjugate plane is the object plane.

3. A reflection and refraction optical system, comprising:

a first optical system;

a planar beam splitter;

a second optical system including a concave mirror; and a third optical system;

wherein one of said first and third optical systems includes a correcting optical flat plate inclined with respect to an optical axis of said system, for substantially correcting comma produced by said beam splitter, wherein said flat plate is disposed between an object plane and a lens of said first optical system;

wherein a light beam from an object plane passes through said first optical system and said beam splitter, and impinges on said concave mirror of said second optical system; and wherein the light beam incident on said concave mirror is reflected back to said beam splitter and is projected through said third optical system onto an image plane by said beam splitter.

4. A reflection and refraction optical system according to claim 3, wherein said conjugate plane is the object plane.

5. A projection exposure apparatus for projecting a pattern of an original onto a substrate, said apparatus comprising:

a planar beam splitter;

a concave mirror; and a correcting optical flat plate provided between an object plane and a lens and inclined with respect to an optical axis of said apparatus, for substantially correcting comma produced by said beam splitter;

wherein a light beam from an original passes through said beam splitter and impinges on said concave mirror, and wherein the light beam incident on said mirror is reflected back to said beam splitter and is projected onto the substrate by said beam splitter, whereby an image of a pattern of the original is formed on the substrate.

6. An apparatus according to claim 5, wherein said conjugate plane is the object plane.

7. A method of manufacturing microdevices, comprising the steps of:

providing a projection exposure apparatus for projecting a pattern of an original onto a substrate, said apparatus comprising:

a planar beam splitter;

a concave mirror; and a correcting optical flat plate provided between an object plane and a lens and inclined with respect to an optical axis of the apparatus, for substantially correcting comma produced by the beam splitter; and transferring a device pattern of an original onto a substrate by projecting a light beam from an original, wherein the light beam from the original passes through said beam splitter and impinges on said concave mirror, and wherein the light beam incident on said mirror is reflected back to said beam splitter and is projected onto the substrate by said beam splitter, whereby an image of a pattern of the original is formed on the substrate.

8. A projection exposure apparatus for projecting a pattern of an original onto a substrate, said apparatus comprising:

a first optical system;

a planar beam splitter;

a second optical system including a concave mirror; and a third optical system;

wherein one of said first and third optical systems includes a correcting optical flat plate inclined with respect to an optical axis of said apparatus, for substantially correcting comma produced by said beam splitter, wherein said flat plate is disposed between an object plane and a lens of said first optical system;

wherein a light beam from an original passes through said first optical system and said beam splitter, and impinges on said concave mirror of said second optical system; and wherein the light beam incident on said concave mirror is reflected back to said beam splitter and is projected through said third optical system onto the substrate by said beam splitter, whereby a pattern of the original is projected onto the substrate.

9. An apparatus according to claim 8, wherein said conjugate plane is the object plane.

10. A method of manufacturing microdevices, comprising the steps of:

providing a projection exposure apparatus for projecting a pattern of an original onto a substrate, said apparatus comprising:

a first optical system;

a planar beam splitter;

a second optical system including a concave mirror; and a third optical system;

wherein said first optical system includes a correcting optical flat plate inclined with respect to an optical axis of the apparatus, for substantially correcting comma produced by the beam splitter, wherein the flat plate is disposed between an object plane and a lens of the first optical system; and transferring a device pattern of an original onto a substrate by projecting a light beam from an original, wherein the light beam from the original passes through said first optical system and said beam splitter, and impinges on said concave mirror of said second optical system; and wherein the light beam incident on said concave mirror is reflected back to said beam splitter and is projected through said third optical system onto the substrate by said beam splitter, whereby a pattern of the original is projected onto the substrate.

11. A method according to claim 10, wherein said projecting step also includes effectively correcting distortion produced by said beam splitter.

12. An imaging optical system, comprising:

a planar beam splitter;

a concave mirror; and aberration correcting means for substantially correcting aberration produced by said beam splitter;

wherein a light beam from an object plane passes through said beam splitter and impinges on said concave mirror, wherein the light beam incident on said mirror is reflected back to said beam splitter and is projected onto an image plane by said beam splitter, and wherein said correcting means includes a lens disposed eccentrically with respect to an optical axis of said imaging optical system.

13. A reflection and refraction optical system, comprising:

a first optical system;

a planar beam splitter;

a second optical system including a concave mirror; and a third optical system;

wherein at least one of said first, second and third optical systems includes aberration correcting means for substantially correcting aberration produced by said beam splitter;

wherein a light beam from an object plane passes through said first optical system and said beam splitter, and impinges on said concave mirror of said second optical system;

wherein the light beam incident on said concave mirror is reflected back to said beam splitter, and is projected through said third optical system onto an image plane by said beam splitter; and wherein said aberration correcting means includes a lens disposed eccentrically with respect to an optical axis of said reflection and refraction optical system.

14. A projection exposure apparatus for projecting a pattern of an original onto a substrate, said apparatus comprising:

a planar beam splitter;

a concave mirror; and aberration comma correcting means for substantially correcting aberration produced by said beam splitter;

wherein a light beam from the original concave through said beam splitter and impinges on said reflection mirror, wherein the light beam incident on said mirror is reflected back to said beam splitter and is projected onto the substrate by said beam splitter, whereby an image of the pattern of the original is formed on the substrate, and wherein said correcting means includes a lens disposed eccentrically with respect to an optical axis of said projection exposure apparatus.

15. A method of manufacturing microdevices, comprising the steps of:

providing a projection exposure apparatus for projecting a pattern of an original onto a substrate, said apparatus comprising:

a planar beam splitter;

a concave mirror; and aberration correcting means including a lens disposed eccentrically with respect to an optical axis of said projection exposure apparatus, for substantially correcting aberration produced by said beam splitter; and transferring a device pattern of an original onto a substrate by projecting a light beam from an original, wherein the light beam from the original passes through said beam splitter and impinges on said concave mirror, and wherein the light beam incident on said mirror is reflected back to said beam splitter and is projected onto the substrate by said beam splitter, whereby an image of the pattern of the original is formed on the substrate.

16. A projection exposure apparatus for projecting a pattern of an original onto a substrate, said apparatus comprising:

a first optical system;

a planar beam splitter;

a second optical system including a concave mirror; and a third optical system;

wherein at least one of said first, second and third optical systems includes aberration correcting means for substantially correcting aberration produced by said beam splitter;

wherein a light beam from the original passes through said first optical system and said beam splitter, and impinges on said concave mirror of said second optical system;

wherein the light beam incident on said concave mirror is reflected back to said beam splitter, and is projected through said third optical system onto the substrate by said beam splitter, whereby a pattern of the original is projected onto the substrate; and wherein said aberration correcting means includes a lens disposed eccentrically with respect to an optical axis of said projection exposure apparatus.

17. A method of manufacturing microdevices, comprising the steps of:

providing a projection exposure apparatus for projecting a pattern of an original onto a substrate, said apparatus comprising:

a planar beam splitter;

a concave mirror; and aberration correcting means, including a lens disposed eccentrically with respect to an optical axis of said projection exposure apparatus, for substantially correcting aberration produced by said beam splitter; and transferring a device pattern of an original onto a substrate by projecting a light beam from an original, wherein the light beam from the original passes through said beam splitter and impinges on said concave mirror, and wherein the light beam incident on said mirror is reflected back to said beam splitter and is projected onto the substrate by said beam splitter, whereby an image of the pattern of the original is formed on the substrate.

18. An imaging optical system, comprising:

a planar beam splitter;

a concave mirror;

wherein a light beam from an object plane passes through said beam splitter and impinges on said concave mirror, wherein the light beam incident on said mirror is reflected back to said beam splitter and is projected onto an image plane by said beam splitter, and wherein said concave mirror is disposed eccentrically with respect to an optical axis of said imaging optical system so as to substantially correct an aberration produced by said beam splitter.

19. A reflection and refraction optical system, comprising:

a first optical system;

a planar beam splitter;

a second optical system including a concave mirror; and a third optical system;

wherein a light beam from an object plane passes through said first optical system and said beam splitter, and impinges on said concave mirror of said second optical system;

wherein the light beam incident on said concave mirror is reflected back to said beam splitter, and is projected through said third optical system onto an image plane by said beam splitter; and wherein said concave mirror is disposed eccentrically with respect to an optical axis of said reflection and refraction optical system so as to substantially correct an aberration produced by said beam splitter.

20. A projection exposure apparatus for projecting a pattern of an original onto a substrate, said apparatus comprising:

a planar beam splitter; and a concave mirror;

wherein a light beam from the original passes through said beam splitter and impinges on said concave mirror, wherein the light beam, incident on said mirror is reflected back to said beam splitter and is projected onto the substrate by said beam splitter, whereby an image of the pattern of the original is formed on the substrate, and wherein said concave mirror is disposed eccentrically with respect to an optical axis of said projection exposure apparatus so as to substantially correct an aberration produced by said beam splitter.

21. A method of manufacturing microdevices, comprising the steps of:

providing a projection exposure apparatus for projecting a pattern of an original onto a substrate, said apparatus comprising:

a planar beam splitter; and a concave mirror; and transferring a device pattern of an original onto a substrate by projecting a light beam from an original, wherein the light beam from the original passes through said beam splitter and impinges on said concave mirror, and wherein the light beam incident on said mirror is reflected back to said beam splitter and is projected onto the substrate by said beam splitter, whereby an image of the pattern of the original is formed on the substrate, wherein said concave mirror is disposed eccentrically with respect to an optical axis of said projection exposure apparatus so as to substantially correct an aberration produced by said beam splitter.

22. A projection exposure apparatus for projecting a pattern of an original onto a substrate, said apparatus comprising:

a first optical system;

a planar beam splitter;

a second optical system including a concave mirror; and a third optical system;

wherein a light beam from the original passes through said first optical system and said beam splitter, and impinges on said concave mirror of said second optical system;

wherein the light beam incident on said concave mirror is reflected back to said beam splitter, and is projected through said third optical system onto the substrate by said beam splitter, whereby a pattern of the original is projected onto the substrate; and wherein said concave mirror is disposed eccentrically with respect to an optical axis of said projection exposure apparatus so as to substantially correct an aberration produced by said beam splitter.

23. A method of manufacturing microdevices, comprising the steps of:

providing a projection exposure apparatus for projecting a pattern of an original onto a substrate, said apparatus comprising:

a planar beam splitter; and a concave mirror; and transferring a device pattern of an original onto a substrate by projecting a light beam from an original, wherein the light beam from the original passes through said beam splitter and impinges on said concave mirror, and wherein the light beam incident on said mirror is reflected back to said beam splitter and is projected onto the substrate by said beam splitter, whereby an image of the pattern of the original is formed on the substrate, wherein said concave mirror is disposed eccentrically with respect to an optical axis of said projection exposure apparatus so as to substantially correct an aberration produced by said beam splitter.

* * * * *

UNITED STATES PATENT AND TRADEMARK OFFICE
CERTIFICATE OF CORRECTION

PATENT NO. : 5,583,696  Page 1 of 3
DATED : December 10, 1996
INVENTOR(S) : KAZUHIRO TAKAHASHI It is certified that error appears in the above-indentified patent and that said Letters Patent is hereby corrected as shown below:

COLUMN 1:

Line 21, "of portion" should read --portion of--.
Line 59, "planner" should read --planar--.

COLUMN 2:

Line 3, "planner" should read --planar--.
Line 15, "planner" should read --planar--.

COLUMN 3:

Line 2, "(nm))" should read --nm)--.

UNITED STATES PATENT AND TRADEMARK OFFICE
CERTIFICATE OF CORRECTION

PATENT NO. : 5,583,696
DATED : December 10, 1996
INVENTOR(S) : KAZUHIRO TAKAHASHI It is certified that error appears in the above-indentified patent and that said Letters Patent is hereby corrected as shown below:

COLUMN 4:

Line 2, "of" should read --in--.
   Line 64, "place" should read --placed--.

COLUMN 5:

Line 10, ($\lambda$~248" should read --($\lambda\approx$248-- and " $\lambda$~193" should read --$\lambda\approx$193--.
   Line 11, "$\lambda$~250" should read --$\lambda\approx$250--.
   Line 16, "3" should read --4--.

UNITED STATES PATENT AND TRADEMARK OFFICE
CERTIFICATE OF CORRECTION

PATENT NO. : 5,583,696　　　　　　Page   3   of   3

DATED : December 10, 1996

INVENTOR(S) : KAZUHIRO TAKAHASHI

It is certified that error appears in the above-indentified patent and that said Letters Patent is hereby corrected as shown below:

COLUMN 8:

Line 35, delete "comma".
    Line 37, "concave" should read --passes--.
    Line 38, "reflection" should read --concave--.

COLUMN 10:

Line 16, "beam," should read --beam--.

Signed and Sealed this

Thirteenth Day of May, 1997

Attest:

BRUCE LEHMAN

*Attesting Officer*　　　　*Commissioner of Patents and Trademarks*